United States Patent
Tomita

[19]

[11] Patent Number: 6,058,087
[45] Date of Patent: May 2, 2000

[54] INFORMATION RECORDING APPARATUS, INFORMATION RECORDING MEDIUM AND INFORMATION REPRODUCING APPARATUS

[75] Inventor: Yoshimi Tomita, Tsurugashima, Japan

[73] Assignee: Pioneer Electronic Corporation, Tokyo, Japan

[21] Appl. No.: 08/879,969

[22] Filed: Jun. 20, 1997

[30] Foreign Application Priority Data

Jun. 21, 1996 [JP] Japan .................. P08-162240

[51] Int. Cl.[7] ........................................ H04N 5/76
[52] U.S. Cl. .................. 369/59; 341/58; 341/59
[58] Field of Search ................... 369/59, 47, 48, 369/124, 58, 54; 341/58, 59, 69, 68, 70–74, 95, 106; 360/40, 41, 49

[56] References Cited

U.S. PATENT DOCUMENTS

| | | | |
|---|---|---|---|
| 5,537,422 | 7/1996 | Shimpuku et al. | 341/59 |
| 5,638,064 | 6/1997 | Mori et al. | 341/58 |
| 5,757,296 | 5/1998 | Ishizawa | 341/59 |

*Primary Examiner*—Thang V. Tran
*Attorney, Agent, or Firm*—Morgan, Lewis & Bockius LLP

[57] ABSTRACT

An information recording apparatus 100, wherein record data whose length is 8 bits is modulated to code data whose length is 16 bits by using 8/16 modulation-demodulation method, and a data-sector including a plurality of the code data is recorded onto a DVD-RAM 1. In case that the last code data placed at the end-part of the data-sector is recorded onto the DVD-RAM 1, a discriminating data to used for demodulating the last code data to record data by using the 8/16 modulation-demodulation method is generated, and the discriminating data is recorded onto the DVD-RAM 1 at the place immediately after the last code data.

29 Claims, 12 Drawing Sheets

FIG.2

| RECORD DATA | STATE 1 | | STATE 2 | | STATE 3 | | STATE 4 | |
|---|---|---|---|---|---|---|---|---|
| | CODE DATA<br>MSB　　　　LSB | STATE INFO. | CODE DATA<br>MSB　　　　LSB | STATE INFO. | CODE DATA<br>MSB　　　　LSB | STATE INFO. | CODE DATA<br>MSB　　　　LSB | STATE INFO. |
| 0 | 00100000000001001 | 1 | 01000000100100000 | 2 | 00100000000001001 | 1 | 01000000100100000 | 2 |
| 1 | 00100000000010010 | 1 | 00100000000010010 | 1 | 10000000100100000 | 3 | 10000000100100000 | 3 |
| 2 | 00100000100100000 | 2 | 00100000100100000 | 2 | 10000000000010010 | 1 | 10000000000010010 | 1 |
| 3 | 00100000010001000 | 2 | 00100100100100000 | 4 | 00100000010001000 | 2 | 00100100100100000 | 4 |
| 4 | 00100000010010000 | 2 | 00100000010010000 | 2 | 10000000100100000 | 2 | 10000000100100000 | 2 |
| 5 | 00100000000100100 | 2 | 00100000000100100 | 2 | 10010010000000000 | 4 | 10010010000000000 | 4 |
| 6 | 00100000000100100 | 3 | 00100000000100100 | 3 | 10010010000000000 | 4 | 10010010000000000 | 4 |
| 7 | 00100000001001000 | 3 | 01000000000010010 | 1 | 00100000001001000 | 3 | 01000000000010010 | 1 |
| 8 | 00100000010010000 | 3 | 00100000100010000 | 3 | 10000100100000000 | 4 | 10000100100000000 | 4 |
| 9 | 00100100100100000 | 4 | 00100100100100000 | 4 | 10010100100000001 | 1 | 10010100100000001 | 1 |
| 10 | 00100100100100000 | 4 | 00100100100100000 | 4 | 10000100100000001 | 1 | 10000100100000001 | 1 |
| 11 | 00100100100001000 | 1 | 00100100100001000 | 1 | 10000100100010000 | 3 | 10000100100010000 | 3 |
| 12 | 00100100100010000 | 1 | 00100100100010000 | 1 | 10000000100010000 | 2 | 10000000100010000 | 2 |
| 13 | 00100100000000001 | 1 | 00100100000000001 | 1 | 00100100000000001 | 1 | 01000010010000001 | 1 |
| 14 | 00100000001001001 | 1 | 01000000000100100 | 3 | 00100000001001001 | 1 | 01000000100000100 | 3 |
| 15 | 00100000100100001 | 1 | 00100000100100001 | 1 | 10000001001000001 | 1 | 10000001001000001 | 1 |

| ZERO-RUN-LENGTH AT LSB SIDE OF Nth CODE DATA | ZERO-RUN-LENGTH AT MSB SIDE OF (N+1)th CODE DATA |
|---|---|
| 0 ~ 1 | 2 ~ 9  (STATE1) |
| 2 ~ 5 | 1 ~ 5  (STATE2) |
| 2 ~ 5 | 0 ~ 5  (STATE3) |
| 6 ~ 9 | 0 ~ 1  (STATE4) |

FIG. 4

| STATE | 2 | 3 | 3 | 3 |
|---|---|---|---|---|
| 1ST BIT | 0 | 1 | 0 | 1 |
| 13TH BIT | 0 | 0 | 1 | 1 |

FIG. 5a

STATE1 or STATE2

```
         (MSB)               (LSB) (MSB)                (LSB)
SY0 = 0001001001000100 0000000000010001 / 0001001000000100 0000000000010001
SY1 = 0000010000000100 0000000000010001 / 0000010001000100 0000000000010001
SY2 = 0001000000000100 0000000000010001 / 0001000001000100 0000000000010001
SY3 = 0000100000000100 0000000000010001 / 0000100001000100 0000000000010001
SY4 = 0010000000000100 0000000000010001 / 0010000001000100 0000000000010001
SY5 = 0010001001000100 0000000000010001 / 0010001000000100 0000000000010001
SY6 = 0010010010000100 0000000000010001 / 0010000010000100 0000000000010001
SY7 = 0010010001000100 0000000000010001 / 0010010000000100 0000000000010001
```

FIG. 5b

STATE3 or STATE4

```
         (MSB)               (LSB) (MSB)                (LSB)
SY0 = 1001001000000100 0000000000010001 / 1001001001000100 0000000000010001
SY1 = 1000010001000100 0000000000010001 / 1000010000000100 0000000000010001
SY2 = 1001000001000100 0000000000010001 / 1001000000000100 0000000000010001
SY3 = 1000001001000100 0000000000010001 / 1000001000000100 0000000000010001
SY4 = 1000100001000100 0000000000010001 / 1000100000000100 0000000000010001
SY5 = 1000100100000100 0000000000010001 / 1000000100000100 0000000000010001
SY6 = 1001000010000100 0000000000010001 / 1000000001000100 0000000000010001
SY7 = 1000100010000100 0000000000010001 / 1000000010000100 0000000000010001
```

INFORMATION RECORDING APPARATUS, INFORMATION RECORDING MEDIUM AND INFORMATION REPRODUCING APPARATUS

BACKGROUND OF THE INVENTION

1. Field of the Invention

The present invention relates to an information recording apparatus for writing information (data) onto a DVD-RAM (DVD-Random Access Memory), which is capable of reading out information and also writing information.

The present invention also relates to an information recording medium on which information is written by the information recording apparatus.

The present invention further relates to an information reproducing apparatus for reading the information recorded on the information recording medium.

2. Description of the Related Art

A DVD (Digital Video or Versatile Disk) is a recording medium having the about seven times capacity as compared with that of a conventional recording medium such as a CD (Compact disk), an LD (Laser disk) or the like. Recently, the research and development about a DVD are done, especially, the research and development about a standard of a DVD-ROM (DVD-Read Only Memory), which is capable of only reading out the information recorded thereon in advance, are actively done.

Here, as one example of modulation and demodulation methods with respect to the DVD-ROM, so-called 8/16 modulation-demodulation method is proposed. The 8/16 modulation-demodulation method is briefly explained below.

The 8/16 modulation is a method to modulate digital record data, which is constructed by the unit of 8 bits, to code data, which is constructed by the unit of 16 bits, corresponding to each other. The code data is actually recorded onto the DVD-RON. In the 8/16 modulation, four modulation tables are used. In each of the modulation tables, each of the code data constructed of 16 bits corresponding to respective one of the record data constructed of 8 bits are described in advance. Namely, in the 8/16 modulation, one modulation table is selected from four modulation tables, and the record data is modulated to the code data by using the selected modulation table. At this time, the selection of the modulation table is done on the basis of discriminating information called "state information". Namely, the state information is determined in advance in view of so-called zero-run-length, i.e., the number of "0" bits which are arrayed at the end-part in the code data which is obtained to modulate one record data by using the 8/16 modulation. For example, when the $n^{th}$ record data is modulated, the state information, which is used for selecting the modulation table when the $(n+1)^{th}$ record data (the next record data of the $n^{th}$ record data) is modulated, is obtained. Therefore, in case that the $(n+1)^{th}$ record data is modulated, the modulation table is selected on the basis of this state information. Then, the $(n+1)^{th}$ record data is modulated to the code data by using the selected modulation table.

On the other hand, the 8/16 demodulation is the method to demodulate the code data recorded on the DVD-ROM to the record data. In the 8/16 demodulation, for example, the $m^{th}$ code data is demodulated on the basis of the $(m+1)^{th}$ code data (the next code data of the $m^{th}$ code data) by using the demodulation tables. In each of the demodulation tables, each of the record data corresponding to respective one of the code data are described in advance.

However, if the 8/16 modulation-demodulation method used for the DVD-ROM would be adapted for the DVD-RAM capable of reading out information and also writing information, a problem is posed as followings. Namely, in the DVD-RAM, information is not always continuously recorded (written) thereon in time sequence. More particularly, when information is recorded on the DVD-RAM, the information is recorded thereon by the unit of the data-sector constructed by a predetermined quantity (size) of byte-data in order to carry out the error correcting at the time of reproduction. Therefore, in case that the first information constructed of several data-sectors is recorded on the DVD-RAM at first, and next, the second information, which is unrelated to the first information, is recorded thereon, it may happen a case that the recorded data-sectors adjacent to each other are not in series between the first information and the second information. Namely, it may happen a case that the continuity of the data-sector between the first information and the second information is lost or destroyed.

In this case, there is no next code data, which follows the last code data placed at the end-part in the last data-sector placed at the end-portion in the first information, because the recording for the first information is completed when the last code data is recorded on the DVD-RAM. Therefore, if the 8/16 demodulation would be carried out with respect to the last code data, it cannot be done because the next code data, which follows the last code data, does not exist.

SUMMARY OF THE INVENTION

It is therefore an object of the present invention to provide an information recording apparatus, an information recording medium and an information reproducing apparatus, in which code data, which is modulated by using 8/16 modulation-demodulation method and recorded on a DVD-RAM, can be completely demodulated by using 8/16 modulation-demodulation method.

More specifically, as mentioned above, even if a plurality of information unrelated to each other are recorded on the DVD-RAM, the last code data, which is placed at the end-part of the last data-sector placed at the end-portion in these information can be demodulated by using the 8/16 modulation-demodulation method. Therefore, all code data recorded on the DVD-RAM can be correctly demodulated by using the 8/16 modulation-demodulation method, and record data corresponding to the code data can be obtained.

According to the present invention, the above mentioned object can be achieved by an information recording apparatus for record data onto an information recording medium, the apparatus having: an inputting device for inputting record data, whose length is N bits; a modulation device for modulating the inputted record data to code data, whose length is M ($M \geq N$) bits, by using a predetermined modulation-demodulation method, the predetermined modulation-demodulation method having: a modulation method, wherein the $(n+1)^{th}$ record data (n: natural number) is modulated to the $(m+1)^{th}$ code data (m: natural number) including demodulating information for selecting a demodulation table to be used for demodulating the $m^{th}$ code data to the $n^{th}$ record data corresponding to the $m^{th}$ code data, and a demodulation method, wherein the demodulation table is selected from a plurality of demodulation tables on the basis of the demodulating information included in the $(m+1)^{th}$ code data, and the $m^{th}$ code data is demodulated to the $n^{th}$ record data corresponding to the $m^{th}$ code data on the basis of the selected demodulation table; a first recording device for recording a data-sector including a plurality of the modulated code data onto the information recording medium; a generating device for generating a discriminating data including the demodulating information for selecting the demodulation table to be used for demodulating a last code data, which is placed at an end-part of the data-sector, to the record data corresponding to the last code data by using the predetermined modulation-demodulation method on the basis of the inputted record data; and a second recording device for recording the generated discriminating data onto the information recording medium at the place immediately after the last code data.

Thus, when the inputted record data is modulated to the last code data, the discriminating data including the demodulating information for selecting the demodulation table to be used for demodulating a last code data is generated by the generating device. Then, the discriminating data is recorded on the information recording medium at the place immediately after the last code data. Therefore, when the last code data is demodulated to the record data by using the predetermined modulation-demodulation method, the demodulation table can be selected from a plurality of demodulation tables on the basis of the demodulating information included in the discriminating data, and the last code data can be correctly demodulated to the record data corresponding to the last code data on the basis of the selected demodulation table, and thus, information corresponding to the last code data is correctly reproduced.

According to the present invention, the aforementioned object can be achieved by an information recording medium for storing data to be reproduced by an information reproducing apparatus, the information recording medium having a data structure stored therein, said data structure having a plurality of data-sectors, each of the data-sectors including: a plurality of code data, a length of each of the code data being N bits, each of the code data being obtained to modulate each record data whose length is N (N≦M) by using a predetermined modulation-demodulation method, the predetermined modulation-demodulation method comprising a modulation method, wherein the $(n+1)^{th}$ record data (n: natural number) is modulated to the $(m+1)^{th}$ code data (m: natural number) including demodulating information for selecting a demodulation table to be used for demodulating the $m^{th}$ code data to the $n^{th}$ record data corresponding to the $m^{th}$ code data, and a demodulation method, wherein the demodulation table is selected from a plurality of demodulation tables on the basis of the demodulating information included in the $(m+1)^{th}$ code data, and the $m^{th}$ code data is demodulated to the $n^{th}$ record data corresponding to the $m^{th}$ code data on the basis of the selected demodulation table; and a discriminating data placed immediately after a last code data, which is placed at the end-part of the data-sector stored in the information recording medium, a discriminating data including the demodulating information for selecting the demodulation table to be used for demodulating the last code data to the record data corresponding to the last code data by using the predetermined modulation-demodulation method.

Thus, when the last code data included in the data-sector recorded on the information recording medium is demodulated to the record data by using the predetermined modulation-demodulation method, the demodulation table can be selected from a plurality of demodulation tables on the basis of the demodulating information included in the discriminating data recorded on the information recording medium, and the last code data can be correctly demodulated to the record data corresponding to the last code data on the basis of the selected demodulation table, and thus, information corresponding to the last code data is correctly reproduced.

According to the present invention, the aforementioned object can be achieved by an information reproducing apparatus for reproducing information included in a data-sector recorded on an information recording medium, the data-sector including a plurality of code data and a discriminating data, a length of each of the code data being M bits, each of the code data being obtained to modulate each record data whose length is N (N≦M) by using a predetermined modulation-demodulation method, the predetermined modulation-demodulation method having: a modulation method wherein the $(n+1)^{th}$ record data (n: natural number) is modulated to the $(m+1)^{th}$ code data (m: natural number) including demodulating information for selecting a demodulation table to be used for demodulating the $m^{th}$ code data to the n record data corresponding to the $m^{th}$ code data, and a demodulation method wherein the demodulation table is selected from a plurality of demodulation tables on the basis of the demodulating information included in the $(m+1)^{th}$ code data, and the $m^{th}$ code data is demodulated to the n record data corresponding to the $m^{th}$ code data on the basis of the selected demodulation table, the discriminating data placed immediately after a last code data, which is placed at an end-part in the data-sector recorded in the information recording medium, the discriminating data including the demodulating information for selecting the demodulation table to be used for demodulating the last code data to the record data corresponding to the last code data by using the predetermined modulation-demodulation method, the information reproducing apparatus having: a detecting device for detecting the data-sector recorded on the information recording medium; an extracting device for extracting each of the code data and the discriminating data from the detected data-sector; a first demodulation device for demodulating each of the extracted code data to the record data corresponding to each of the extracted code data by using the predetermined modulation-demodulation method when the extracted code data is not a last code data; and a second demodulation device for demodulating the last code data to the record data corresponding to the last code data by a method, wherein the demodulation table is selected from demodulation tables on the basis of the demodulating information included the extracted discriminating data, and the last code data is demodulated to the record data corresponding to the last code data on the basis of the selected demodulation table, when the extracted code data is the last code data.

Thus, the last code data included in the data-sector detected by the detecting device can be correctly demodulated to the record data by the second demodulating device, and information corresponding to the last code data can be correctly reproduced.

According to the present invention, the aforementioned object can be also achieved by an information reproducing apparatus for reproducing information included in a first data-sector and a second data-sector respectively recorded on an information recording medium, each of the first data-sector and the second data-sector including a synchronous data, a plurality of code data and a discriminating data, the synchronous data placed at a top-part of each of the first data-sector and the second data-sector, a length of the synchronous data is L bits (L>M), each of the code data arrayed immediately after the synchronous data in each of the first data-sector and the second data-sector, each of the code data being obtained to modulate each record data whose length is N (N≦M) by using a predetermined modulation-demodulation method, the predetermined modulation-demodulation method having: a modulation method, wherein the $(n+1)^{th}$ record data (n: natural number) is modulated to the $(m+1)^{th}$ code data (m: natural number) including demodulating information for selecting a demodulation table to be used for demodulating the $m^{th}$ code data to the $n^{th}$ record data corresponding to the $m^{th}$ code data, and a demodulation method, wherein the demodulation table is selected from a plurality of demodulation tables on the basis of the demodulating information included in the $(m+1)^{th}$ code data, and the $m^{th}$ code data is demodulated to the $n^{th}$ record data corresponding to the $m^{th}$ code data on the basis of the selected demodulation table, the discriminating data placed immediately after a last code data, which is placed at an end-part of each of the first data-sector and the second data-sector respectively recorded in the information recording medium, the discriminating data including the demodulating information for selecting the demodulation table to be used for demodulating the last code data to the record data corresponding to the last code data by using the predetermined modulation-demodulation method, a length of the discriminating data being the same as the length of the code data, the information reproducing apparatus having a detecting device for detecting the first data-sector and the second data-sector respectively recorded on the information recording medium; an extracting device for extracting the synchronous data, each of the code data and the discriminating data from each of the detected first data-sector and detected second data-sector; a generating device for generating a connection data by connecting K ($1 \leq K \leq M$) bits at the MSB side of the discriminating data included in the first data-sector and a $(L-K)^{th}$ bit at the MSB side and the following bits of the synchronous data included in the second data-sector; a first demodulation device for demodulating each of the extracted code data to the record data corresponding to each of the extracted code data by using the predetermined modulation-demodulation method, when the extracted code data is not a last code data, which is placed at an end-part in each of the data-sector; and a second demodulation device for demodulating the last code data to the record data corresponding to the last code data by a method, wherein the demodulation table is selected from a plurality of demodulation tables on the basis of the generated connecting data, and the last code data is demodulated to the record data corresponding to the last code data on the basis of the selected demodulation table, when the extracted code data is the last code data.

Thus, the last code data included in the data-sector detected by the detecting device can be correctly demodulated to the record data by the second demodulating device on the basis of the connection data generated by the generating device, and information corresponding to the last code data can be correctly reproduced.

BRIEF DESCRIPTION OF THE DRAWINGS

FIG. 2 is a diagram for showing an example of a part of a modulation table by using 8/16 modulation;

FIG. 3 is a figure for explaining the relation between the zero-run-length of the code data and the state with respect to the modulation table;

FIG. 4 is a figure for explaining the relations between the states and the contents of bits of the code data;

FIG. 5a is a figure for showing an example of sync-patterns corresponding to the state 1 and state 2;

FIG. 5b is a figure for showing an example of sync-patterns corresponding to the state 3 and state 4;

DETAILED DESCRIPTION OF THE PREFERRED EMBODIMENTS

Referring to the accompanying drawings, embodiments of the present invention will be now explained. In the following explanation, the present invention is adapted for recording and reproducing a DVD-RAM using 8/16 modulation-demodulation method as a predetermined modulation-demodulation method.

(I) Embodiment of Information Recording Apparatus and Information Recording Medium An embodiment of an information recording apparatus of the present invention and an information recording medium of the present invention on which information is recorded by using the information recording apparatus is explained with FIGS. 1 to 6.

Figure 1:
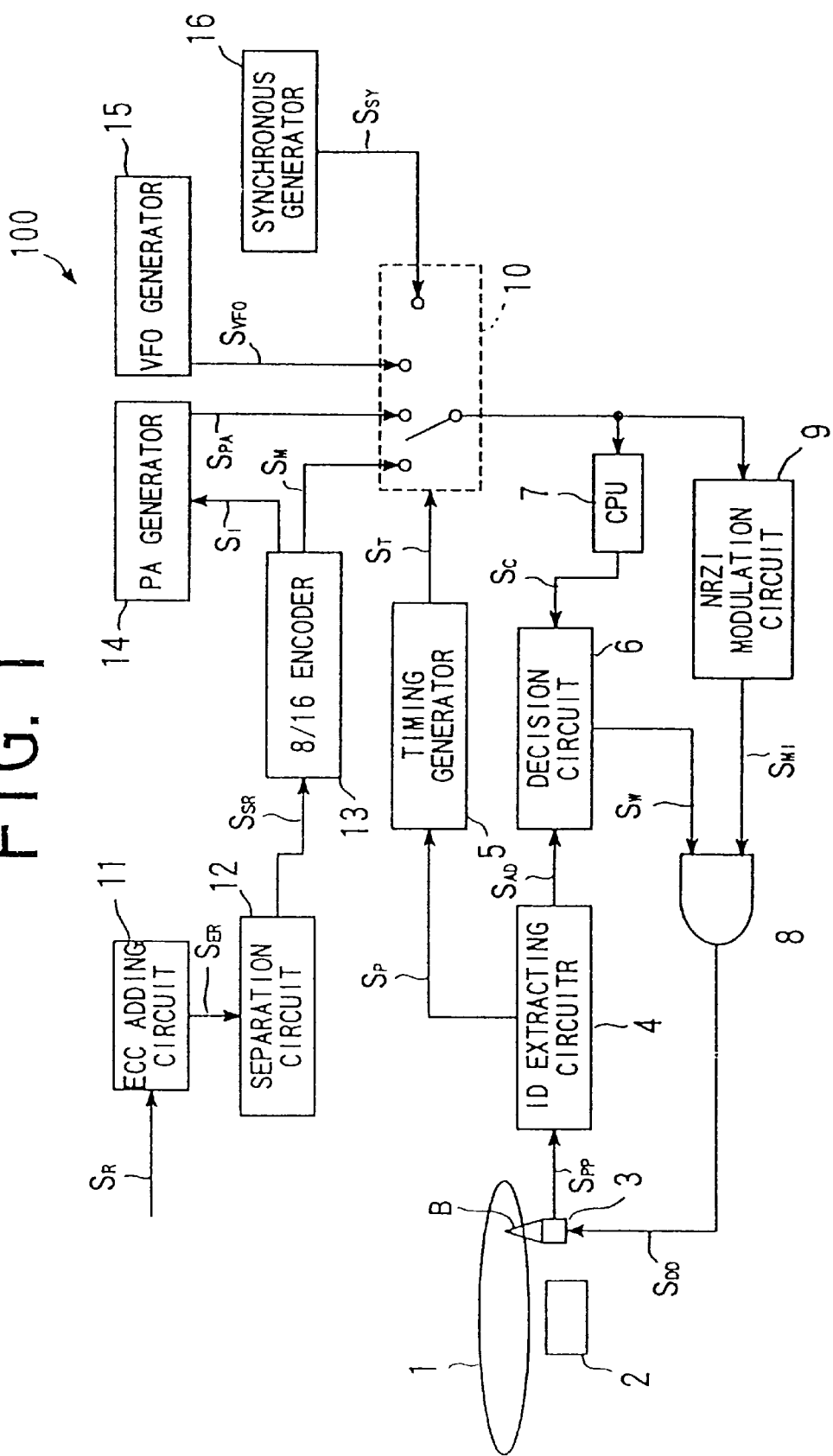
FIG. 1 is a block diagram showing an outline construction of an information recording apparatus of an embodiment.

In FIG. 1, an outline construction of the information recording apparatus 100 of the present invention is shown. Actually, the information recording apparatus 100 has various control sections to control a focus servo, a tracking servo, spindle servo, and so on; a display section to display a condition of an operation of the information recording apparatus 100; and an input control section to input various information. However, these section are omitted in FIG. 1 in order to make the explanation for the present invention understandable.

In FIG. 1, the information recording apparatus 100 is to record information onto the DVD-RAM 1, which is one example of an information recording medium. The information recording apparatus 100 has a spindle motor 2, an optical pickup 3, an ID extracting circuit 4, a timing generator 5, a decision circuit 6, a CPU 7, an AND gate circuit 8, an NRZL (Non Return to Zero Inverted) modulation circuit 9, a switch 10, an ECC (Error Correcting Code) adding circuit 11, a separation circuit 12 as one example of an inputting device, an 8/16 encoder 13 as one example of a modulation device, a post-amble generator 14 as one example of a generation device, a VFO (Variable Frequency Oscillator) generator 15, and a synchronous generator 16. In the present embodiment, one example of a recording device is constructed of the optical pickup 3, the ID extracting circuit 4, the timing generator 5, the decision circuit 6, the CPU 7, the AND gate circuit 8, the NRZL modulation circuit 9 and the switch 10.

In operation, for the purpose of recording information onto the DVD-RAM 1, a record signal $S_R$ is inputted to the ECC adding circuit 11 from the external by the unit of 8 bits. When the record signal $S_R$ is inputted, the ECC adding circuit 11 makes a group constructed of 16 data-blocks included in the inputted record signal $S_R$, and appends an error correcting code (ECC), which is used for error correcting at the time of reproduction, to this group. Then, the ECC adding circuit 11 outputs an appended-record signal $S_{ER}$, which is the record signal $S_R$ to which the ECC is appended, to the separation circuit 12.

The separation circuit 12 separates the appended-record signal $S_{ER}$ by the unit of one data-block, and outputs this separated data-block as a block-record signal $S_{SR}$ by the unit of one data-block.

Then, the 8/16 encoder 13 modulates the record data, whose length is 8 bits, and included in the block-record signal $S_{SR}$, to the code data, whose length is 16 bits.

Figure 4:
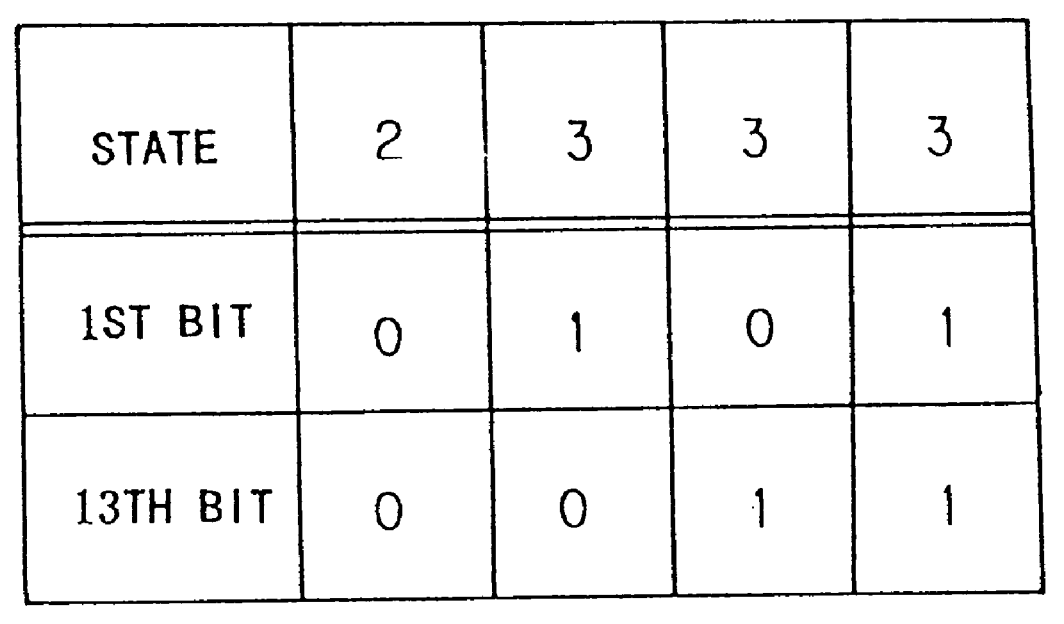

Here, 8/16 modulation, which is executed by the 8/16 encoder 13, is explained with FIGS. 2 to 4.

The 8/16 modulation is a method to modulate the record data constructed of 8 bits to the code data constructed of 16 bits by using four modulation tables. Namely, in the 8/16 modulation, one modulation table is selected from four modulation tables, and the record data is modulated to the code data by using the selected modulation table.

As shown in FIG. 2, each of four modulation tables is respectively called as a "state 1", a "state 2", a "state 3" and a "state 4". In each of the modulation tables, each of the code data constructed of 16 bits corresponding to respectively one of the record data constructed of 8 bits are described in advance. The record data is constructed of 8 bits, and thus, the total number of the record data is 256, so that 256 code data are actually described in each of the modulation tables.

In the 8/16 modulation, the selection of the modulation table is performed on the basis of discriminating information called "state information". For example, in case that the $(n+1)^{th}$ record data, which is the next record data of the $n^{th}$ record data, is modulated to the code data by using the 8/16 modulation, the state of the modulation table is decided on the basis of the state information with respect to the $(n+1)^{th}$ record data. Then, the modulation table corresponding to the decided state is selected, and the $(n+1)^{th}$ record data is modulated to the code data by using the selected modulation table.

More specifically, the state information with respect to the $(n+1)^{th}$ record data is obtained when the $n^{th}$ record data is modulated to the code data. Namely, as shown in FIG. 2, in each of the modulation table, not only each of the code data corresponding to each of the record data but also the state information to select the state of the modulation table with respect to the next code data are described in advance such that each of the state information corresponds to each of the code data. For example, when the $n^{th}$ record data is modulated to the code data by using a modulation table, the state information for the next code data, i.e. the state information for the code data corresponding to the $(n+1)^{th}$ record data, is also recognized. Thereafter, when the $(n+1)^{th}$ record data is to be modulated to the code data, the state of the modulation table is decided on the basis of the state information recognized at the time of modulating the $n^{th}$ record data to code data.

Here, the reason why it is necessary to use four modulation table at the time of the 8/16 modulation is explained below.

Each of the code data is set in accordance with the rule with respect to the limitation of zero-run-length. Here, the zero-run-length is the length of the series "0" bits, i.e., the number of "0" bits which are repeatedly and continuously arrayed in the code data. The limitation of zero-run-length is determined in advance on the basis of the allowable minimum length and the allowable maximum length of the information pit formed on the surface of the DVD-RAM 1 when the code data is recorded on the DVD-RAM 1. The allowable minimum length is set on the basis of the minimum length of the information pit which it is possible to detect by an information reproducing apparatus. The allowable maximum length is set on the basis of the maximum length of the information pit for which it is possible to stabilize a servo control such as a tracking servo control of the information reproducing apparatus. For example, the allowable minimum length is "2", and the allowable maximum length is "10".

Further, the zero-run-length at the place where the two code data adjacent to each other are connected obeys the aforementioned limitation of zero-run-length. Namely, after the 8/16 modulation is preformed, the total of the zero-run-length of the end-part (LSB side) of the code data and the zero-run-length of the beginning-part (MSB side) of the next code data are always in the range of 2 to 10 as shown in FIG. 3. Therefore, in the 8/16 modulation, the suitable modulation table is selected from four modulation tables on the basis of the state information, and the code data is modulated by using the selected suitable modulation table such that all code data obey the rule with respect to the limitation of the zero-run-length. For example, if the zero-run-length at the LSB side of the code data which is obtained to modulate the $n^{th}$ record data is "1" (the number of the bit "0" at the LSB side of the code data is "1"), the "state 1" is selected, and the $(n+1)^{th}$ record data is modulated to the code data by using the modulation table corresponding to the "state 1".

As mentioned above, in the 8/16 encoder 13, the record data is modulated to the code data by using the state information, and the code data is outputted to the 1st input-terminal of the switch 10 as a code data signal $S_M$.

Further, when the 8/16 encoder 13 modulates the last record data placed at the end-part of the data-block included in the block-record signal $S_{SR}$, the 8/16 encoder 13 outputs the state information corresponding to this modulated code data (hereinbelow it is referred to as "last code data"), and this state information is inputted into the post-amble generator 14 (hereinbelow it is referred to as "PA generator 14") as a state information signal $S_I$.

The PA generator 14 generates a post-amble (hereinbelow it is referred to as "PA") corresponding to the state information of the last code data, which is obtained to modulated the last record data placed at the end-part of the data-block included in the block-record signal $S_{SR}$, and outputs the PA to the 2nd input-terminal of the switch 10 as a PA signal $S_{PA}$.

Here, the PA is generated by the PA generator 14 on the basis of the state information of the last code data. The PA is designed for demodulating the last code data to the record data corresponding to each other by the 8/16 demodulation, as explain below. Further, the PA is digital data constructed of 16 bits in the same manner as other code data. Concretely, the PA is constructed in accordance with the following qualifications. Namely, the PA is constructed in accordance with the limitation of zero-run-length with relation to the other code data placed in front and behind of the PA. Furthermore, there are two types of the PA. Namely, the bit-construction of the PA of one type is such that the 1st bit of MSB side is "1" and the 13th bit at the MSB side is "0", for example, "0001000100000000b" ("b" indicates that the number is a binary). The bit-construction of the PA of the other type is such that the 1st bit of MSB side is "0" and the 13th bit of MSB side is "0", for example, "1001000100000000b". In case that the state information corresponding to the last code data indicates the "state 2", the PA of the aforementioned one type is generated. In case that the state information corresponding to the last code data indicates the "state 3", the PA of the aforementioned the other type is generated. In addition, if the state information corresponding to the last code data is the "state 1" or the "state 4", the PA of the aforementioned one or the other type is generated.

The reason why there are two types of the PA is explained.

The PA is used for 8/16 demodulation, which is carried out by the information reproducing apparatus.

Here, the 8/16 demodulation is the method to demodulate the code data to the record data. In case that the code data is demodulated to the record data, if each of the code data completely corresponds to each of the record data, it would be possible to carry out the demodulation by using only one demodulation table in which all record data corresponding to each of the code data are described. However, in the 8/16 demodulation, there are some code data corresponding to two record data. Namely, as shown in FIG. 2, for example, the code data CD1 and CD2 are double, and they are the same regardless each of the corresponded record data is different from each other. Therefore, it is impossible to carry out the 8/16 demodulation by using only one demodulation table.

Therefore, at least two demodulation tables is used for the 8/16 demodulation. In the first demodulation table, the record data corresponding to one code data among the double code data is described, and in the second demodulation table, the record data corresponding to the other code data among the double code data is described. Then, when the 8/16 demodulation is to be performed, the first or second demodulation table is alternatively selected.

Further, the selection of the demodulation table is based on the bit-construction of the next code data. Namely, for example, in case that the $m^{th}$ code data is demodulated, one or the other demodulation table is selected from two demodulation tables on the basis of the bit-construction of the $(m+1)^{th}$ code data.

More concretely, all code data described in the "state 2" of the modulation table used for the 8/16 modulation are constructed such that the 1st bits and 13th bits at the MSB side are "0". On the other hand, all code data described in the "state 3" of the modulation table are constructed such that one of the 1st bits and the 13th bit at the MSB side of are "1". Here, when the record data is modulated to the code data by using the 8/16 modulation, in case that the $m^{th}$ code data is double, the $(m+1)^{th}$ code data, which is placed at the next portion of the $m^{th}$ code data, is always selected from the code data described in the "state 2" or the "state 3" of the modulation table. Therefore, when the 8/16 demodulation is done, the 1st bit and the 13th bit of the $(m+1)^{th}$ code data are checked, and it is judged whether the state of the $(m+1)^{th}$ code data is in the "state 2" or the "state 3". In case that the $m^{th}$ code data is double, if the $(m+1)^{th}$ code data is in the "state 2", the first demodulation is selected, and the $m^{th}$ code data is demodulated to the record data corresponding this $m^{th}$ code data by using the first demodulation table. Similarly, if the $(m+1)^{th}$ code data is in the "state 3", the second demodulation is selected, and the $m^{th}$ code data is demodulated to the record data corresponding this $m^{th}$ code data by using the second demodulation table.

In this manner, in the 8/16 demodulation, if the $m^{th}$ code data is double, one demodulation table is selected among the two demodulation table on the basis of the state of the $(m+1)^{th}$ code data, and the $m^{th}$ code data is correctly demodulated to the record data only corresponding to the $m^{th}$ code data on the basis of the selected demodulation table.

As mentioned above, the bits-construction (with respect to the 1st bit and the 13th bit) of the PA is similar to that of code data in the "state 2" or the "state 3". Therefore, in case that the 8/16 demodulation with respect to the last code data is done, the 1st bit and the 13th bit of the PA are checked, and the bit-construction thereof is judged. Thus, if the last code data is double, the record data corresponding to this last code data can be correctly demodulated on the basis of the PA.

Next, the VFO generator 15 generates a VFO signal $S_{VFO}$ for generating the reproduction-clock, which is used for the control of the reproducing operation at the time of the reproduction for the DVD-RAM 1, and the VFO generator 15 outputs to the 3rd input-terminal of the switch 10. The VFO signal $S_{VFO}$ is constructed by a pattern repeated, for example, "1000b".

The synchronous generator 16 generates the sync-pattern to be used for a synchronous signal $S_{SY}$ at the time of the reproduction for the DVD-RAM 1.

Here, referring to FIG. 5, the synchronous signal $S_{SY}$ is explained in detail.

The synchronous signal SYY includes a plurality of different sync-patterns. Concretely, one kind of the sync-patterns are shown in FIG. 5a, and these patterns correspond to the "state 1" and the "state 2". The other kind of the sync-patterns are shown in FIG. 5b, and these patterns correspond to the "state 3" and the "state 4". Further, each kind of the sync-patterns has 8 patterns, i.e. the pattern 0 (sync 0) to the pattern 7 (sync 7), and each of the sync-patterns is constructed in accordance with the aforementioned the rule with respect to the limitation of zero-run-length. Furthermore, as shown in FIGS. 5a and 5b, there are two types of sync-patterns for each of the sync-patterns 0 to 7, and one of the sync-pattern is alternatively selected under the DSV (Digital Sum Variation) control at the time of reproduction for the DVD-RAM 1. The synchronous signal $S_{SY}$ is outputted to the 4th input-terminal of the switch 10.

On the other hand, the DVD-RAM 1 is rotated in the predetermined rotation number. Further, the optical beam B to be used for recording information is irradiated by the optical pickup 3, and the reflective light, which is formed of the optical beam B reflected in the DVD-RAM 1, is detected by the optical pickup 3. Therefore, ID part information, which is recorded in advance on the DVD-RAM 1 in the predetermined intervals, is detected, and the optical pickup 3 outputs a detection signal $S_{PP}$ including the ID part information. The ID part information includes the address data, which indicates the address of the information recorded on the DVD-RAM 1.

Further, the detection signal S is inputted into the ID extracting circuit 4, and in the ID extracting circuit 4, the ID part information is extracted from the detection signal SYY. Then, the ID extracting circuit 4 outputs a position signal $S_P$, which indicates the timing when the top position of the ID part information is detected, and the ID extracting circuit 4 also outputs the address information included in the ID part information, as the address signal SAD.

The aforementioned position signal $S_P$ is inputted into the timing generator 5, and the timing generator 5 generates a timing signal $S_T$ on the basis of the position signal $S_P$. The timing signal $S_T$ is used for switching the switch 10. Namely, the switch 10 is switched by the position signal $S_P$, and thus, the code data signal $S_M$, the PA signal $S_{PA}$, the VFO signal $S_{VFO}$ and the synchronous signal $S_{SY}$ are outputted from the output-terminal of the switch 10. Therefore, the code data, the PA, the VFO and the sync-signal are respectively recorded onto the DVD-RAM 1, based on a predetermined recording format explained below.

In contrast, the address signal $S_{AD}$ outputted from the ID extracting circuit 4 is inputted into the decision circuit 6. Further, a control signal $S_C$ is also inputted into the decision circuit 6. The control signal $S_C$ is generated by the CPU 7. Namely, the CPU 7 recognizes the contents of the signals outputted from the output-terminal of the switch 10, and the CPU 7 outputs the result of the recognition, as the control signal $S_C$. Then, the decision circuit 6 generates and outputs a decision signal $S_W$ on the basis of the contents of signals outputted from the switch 10 (the control signal $S_C$) and the address information included in the ID part information (the address signal $S_{AD}$). The decision signal $S_W$ is used for deciding whether a modulation signal $S_{MI}$ outputted from the NRZI modulation circuit 9 is recorded onto the DVD-RAM 1 or not. The modulation signal $S_{MI}$ is generated by the NRZI modulation circuit 9. The NRZI modulation circuit 9 carries out the NRZI modulation with respect to the signals outputted from the switch 10 (i.e. the code data signal $S_M$, the PA signal $S_{PA}$, VFO signal $S_{VFO}$ and the synchronous signal $S_{SY}$)

Thereafter, the decision signal $S_W$ is inputted into the AND gate circuit 8 together with the aforementioned modulation signal $S_{MI}$, and the AND gate circuit 8 carries out the AND operation with respect to the decision signal $S_W$ and the modulation signal $S_{MI}$, and thus, a writing signal $S_{DD}$ is generated. This writing signal $S_{DD}$ is used for controlling the irradiation of the optical beam B to used for recording information onto the DVD-RAM 1. Concretely, the writing signal $S_{DD}$ is inputted into the optical pickup 3, and thus, the laser diode of the optical pickup 3 is driven. Therefore, the optical beam B for recording information is irradiated to the DVD-RAM 1, and the modulation signal $S_{MI}$ is recorded onto the DVD-RAM 1.

Figure 6:
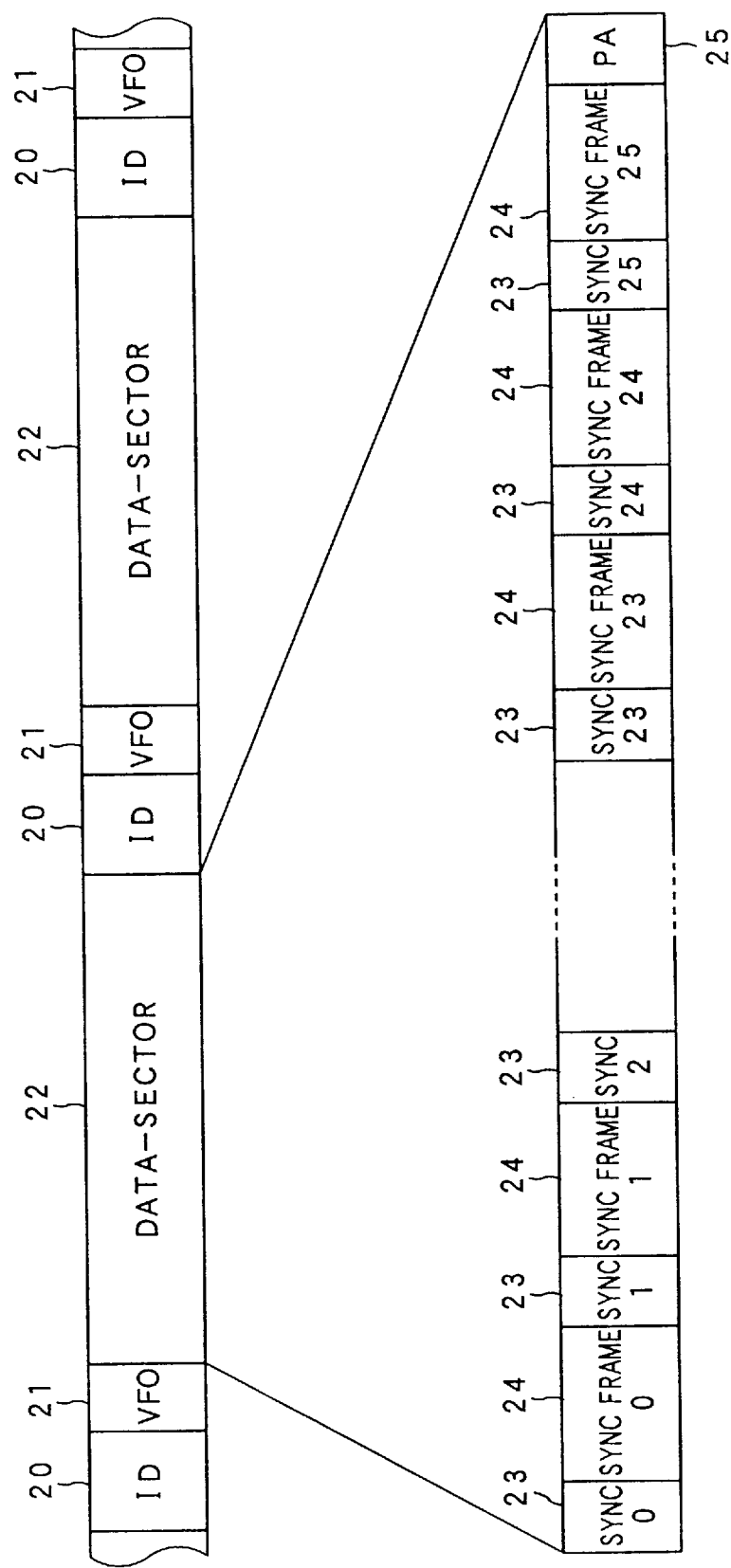
FIG. 6 is a diagram for explaining the recording format of a DVD-RAM.

Next, the recording format to be used for recording the modulation signal $S_{MI}$ onto the DVD-RAM 1, is explained with FIG. 6. In FIG. 6, the physical recording format on the one track TR of the DVD-RAM 1 is shown.

At first, as shown in FIG. 6, the switch 10 of the information recording apparatus 100 is switched on the basis of the timing signal $S_T$ such that the VFO signal $S_{VFO}$ is recorded immediately after the ID part information, which is pre-format on the DVD-RAM 1 in advance. Therefore, the VFO part 21, e.g. "1000b", is recorded on the DVD-RAM 1 immediately after the ID part 20.

Next, the data-sector 22 is formed on the DVD-RAM 1 immediately after the VFO part 21. Namely, the switch 10 is switched on the basis of the timing signal $S_T$ such that a sync "0" included in the synchronous signal $S_{SY}$ is recorded on the DVD-RAM 1 at the beginning part of the data-sector 22, i.e. immediately after VFO part 21. Therefore, the sync 23 (sync "0") is recorded immediately after VFO part 21. The sync "0" is the first synchronous signal of the data-sector 22. Thus, it is standardized that the sync "0" always has the sync-pattern corresponding to the "state 1" or the "state 2".

Next, the switch 10 is switched on the basis of the timing signal $S_T$ such that code data signal $S_M$ is recorded on the DVD-RAM 1 immediately after the sync 23. Therefore, the sync-frame 24 is formed by the code data signal $S_M$, and the sync-frame 24 is recorded on the DVD-RAM 1. Thereafter, a combination of the sync 23 and the sync-frame 24 is formed, and 26 combinations (26 sync-frames) can be included in one data-sector 22. In addition, each of the sync-frames 24 is constructed of 93 bytes. Further, in case that the amount of the combinations included in one data-sector 22 are less than 26, in the rest of the data-sector 22, the unrelated data, which is unrelated the reproducing operation at the time of the reproduction for the DVD-RAM 1, for example, "00000 . . . " or "11111 . . . " is recorded.

Further, the switch 10 is switched on the basis of the timing signal $S_T$ such that the PA signal $S_{PA}$ is recorded on the DVD-RAM 1 at the end-part (last) of one data-sector 22, and thus, a PA part 25 is formed at the end-part of the data-sector 22. Concretely, as mentioned above, "0001000100000000b" (state 2) or "1001000100000000b" (state 3) is recorded at the end-part of the data-sector 22 on the DVD-RAM 1 as the PA part 25.

As mentioned above, according to the information recording apparatus 100 of the embodiment, the PA part 25 is formed and recorded at the end-part of the data-sector 22 when the code data is recorded onto the DVD-RAM 1 by using the 8/16 modulation. Therefore, when the last code data placed at the end-part of the data-sector 22 (immediately before the PA part 25) is demodulated to the record data by using the 8/16 demodulation, one modulation table can be selected from the two demodulation tables on the basis of whether the state of the PA part 25 is the "state 2" or the "state 3", and the last code data can be correctly demodulated by using the 8/16 demodulation and the reproduction with respect to the last code data can be done.

(II) Embodiments of Information Reproducing Apparatus

Embodiments of an information reproducing apparatus of the present invention are explained with FIGS. 7 to 12.

(A) The First Embodiment of Information Reproducing Apparatus

Figure 7:
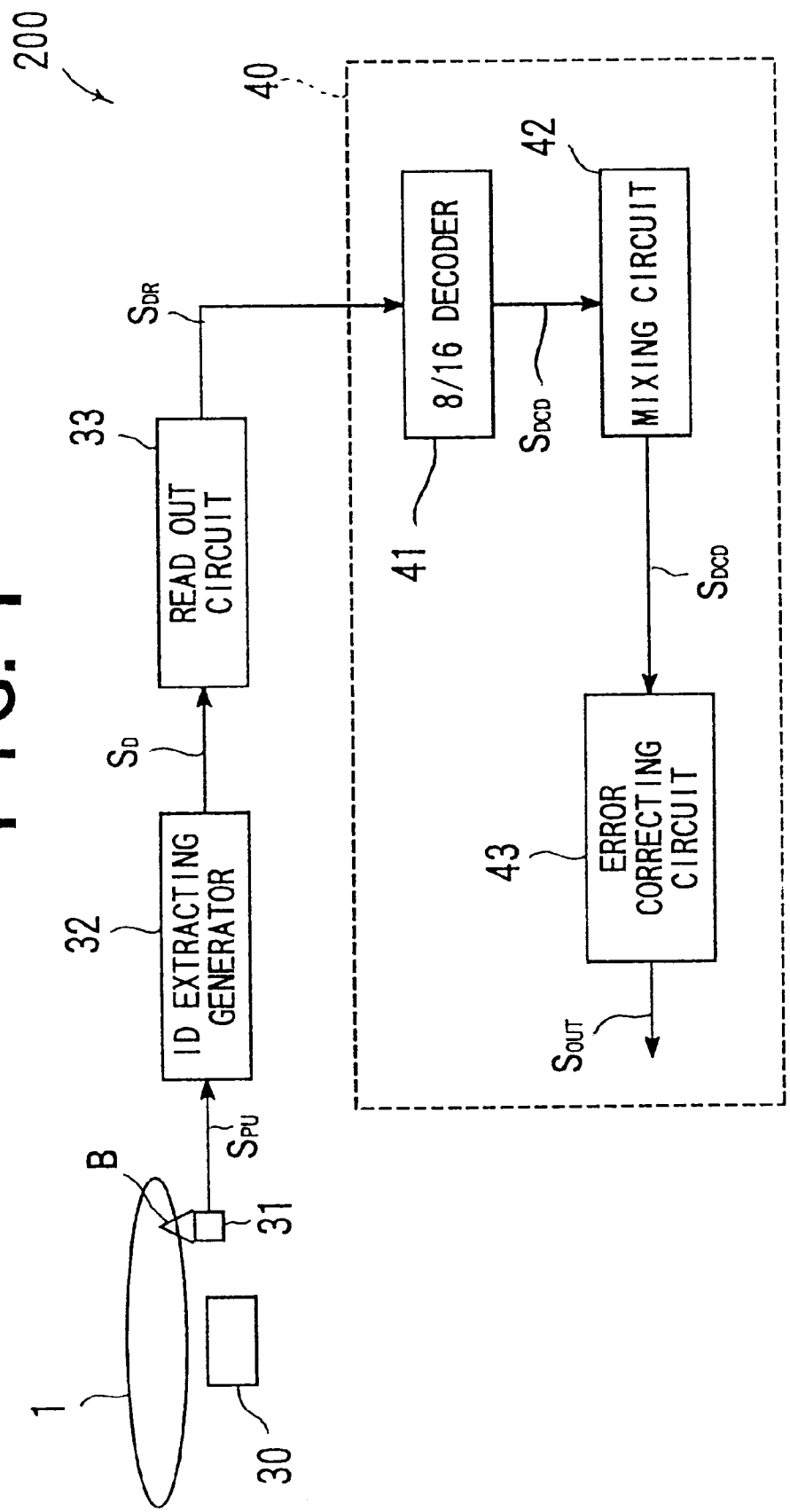
FIG. 7 is a block diagram showing an outline construction of an information reproducing apparatus of the first embodiment.
Figure 8:
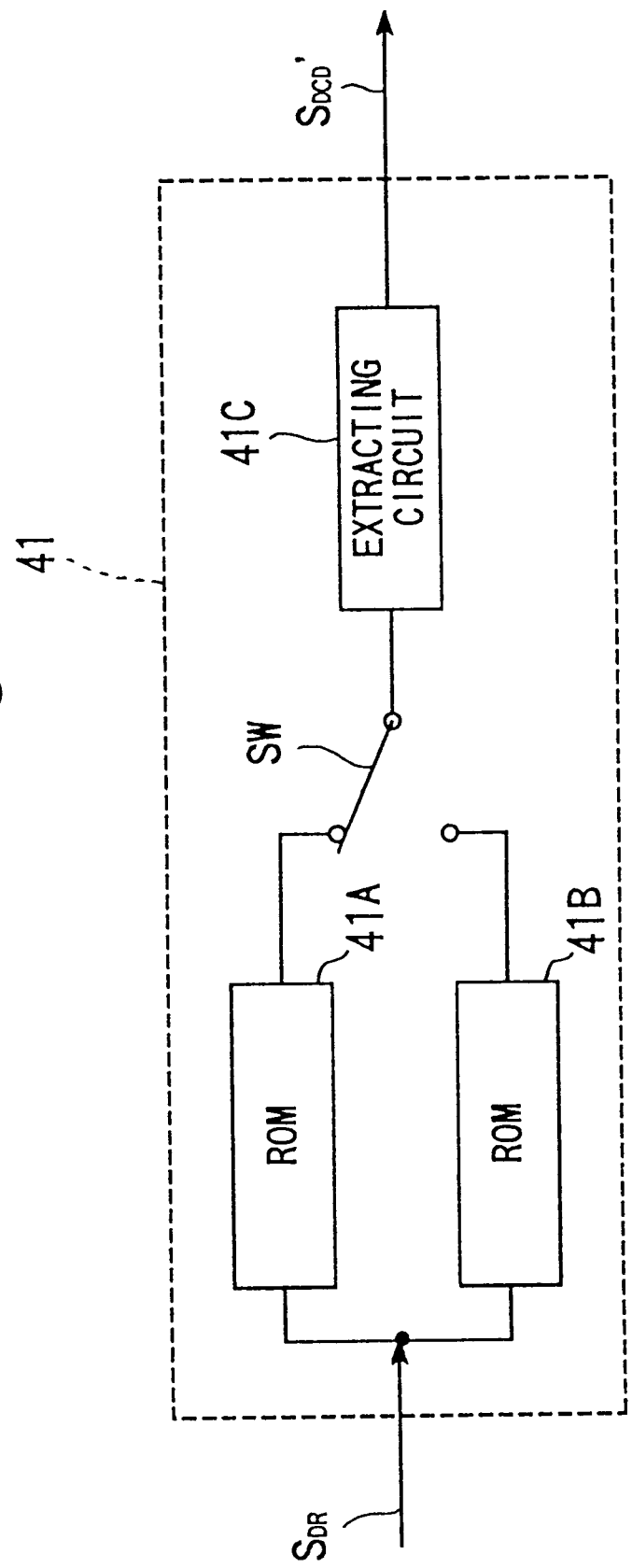
FIG. 8 is a block diagram showing an outline construction of an 8/16 decoder of the first embodiment.

In FIGS. 7 and 8, the construction of an information reproducing apparatus 200 of the first embodiment is shown. The information reproducing apparatus 200 has the exclusive reproducing section to reproduce the DVD-RAM 1.

As shown in FIG. 7, the information reproducing apparatus 200 is constructed of a spindle motor 30, an optical pickup 31 as one example of a detecting device, an ID extracting circuit 32, a read out circuit 33 as one example of a extracting device and a demodulation section 40. In case that the aforementioned information recording apparatus 100 and the information reproducing apparatus 200 of the this embodiment put in the one body case, it is possible that the spindle motor 2, the optical pickup 3 and the ID extracting circuit 4 constructing the aforementioned information recording apparatus 100 are used for the information reproducing apparatus 200 instead of the spindle motor 30, the optical pickup 31 and the ID extracting circuit 32.

Further, the demodulation section 40 is constructed of an 8/16 decoder 41 as one example of a demodulation device, a mixing circuit 42 and an error correcting circuit 43.

Furthermore, as shown in FIG. 8, the 8/16 decoder 41 is constructed of a ROM 41A, a ROM 41B, a select switch SW and an extracting circuit 41C.

In operation, the DVD-RAM 1, on which the information shown in FIG. 6 is recorded, is rotated in the predetermined rotation number by the spindle motor 30. At this time, the optical beam B to be used for reproduction is irradiated to the DVD-RAM 1 by the optical pickup 31, and the optical pickup 31 receives the reflective light in the DVD-RAN 1. Then, the optical pickup 31 outputs a detection signal $S_{PU}$ including the aforementioned code data signal $S_M$, the PA signal $S_{PA}$, the VFO signal $S_{VFO}$ the synchronous signal $S_{SY}$ and the address signal $S_{AD}$. Then, the detection signal $S_{PU}$ is inputted into the ID extracting circuit 32, and in the ID extracting circuit 32, the address signal $S_{AD}$ is extracted, and thus, the address of the data-sector at the position which the optical beam B is irradiated now is obtained. Then, the ID extracting circuit 32 generates and outputs a data signal $S_D$ including this address of the data-sector and the other signal.

At this time, the VFO signal $S_{VFO}$ included in the detection signal $S_{PU}$ is outputted toward the reproducing clock generation circuit (not shown in figures), and in the reproducing clock generation circuit, the reproducing clock is generate as a standard clock for reproduction.

Next, the read out circuit 33 reads out the code data signal $S_M$ from the data signal $S_D$, and also reads out the PA signal $S_{PA}$ from the PA part 25 placed the end-part of the data-sector 22 included in the data signal $S_D$. Then, the read out circuit 33 outputs a read out signal $S_{DR}$ including the code data signal $S_M$ and the PA signal $S_{PA}$ to the demodulation section 40.

The 8/16 decoder included in the demodulation section 40 demodulates the code data included in the code data signal $S_M$ included in the read out signal $S_{DR}$ to the record data constructed of 8 bits by using the 8/16 demodulation. As mentioned above, in order to carry out the 8/16 demodulation, two demodulation tables are needed. Thus, as shown in FIG. 8, the 8/16 decoder 41 has two memory devices i.e., the ROM 41A and the ROM 41B, and each of the two demodulation tables is respectively memorized in each of the ROM 41A and the ROM 41B.

More specifically, in each of the demodulation table respectively memorized in the ROM 41A and ROM 41B, the record data corresponding to the code data is described. However, as mentioned above, it may happen a case that one code data is demodulated to two kinds of the record data, such as the code data CD1 and CD2 (double code data) as shown in the FIG. 2, and thus, it may happen a case that the record data corresponding to the code data is not correctly demodulated. In order to prevent this case, in one demodulation table memorized in the ROM 41A, each of the record data corresponding to each of the code data expect for the record data corresponding to one code data among the double code data are described in advance. For example, in one demodulation table, the record data corresponding to the code data CD1 is described, but the record data corresponding to the code data CD2 is not described. On the other hand, in the other table memorized in the ROM 41B, each of the record data corresponding to each of the code data except for the record data corresponding to the other code data among the double code data are described. For example, in the other demodulation table, the record data corresponding to the code data CD2 is described, but the record data corresponding to the code data CD1 is not described.

Then, the read out signal $S_{DR}$ is inputted to both of the ROM 41A and the ROM 41B, and in each of the ROM 41A and the ROM 41B, the demodulation is independently done. For example, if the $m^{th}$ code data included in the read out signal $S_{DR}$ is inputted to both of the ROM 41A and the ROM 41B, the demodulation is done in each of the ROM 41A and the ROM 41B, and each of the record data corresponding to the $m^{th}$ code data is outputted from each of the RAM 41A and the RAM 41B. At this time, the bit-construction of the 1st bit and the 13th bit at the MSB side of the $(m+1)^{th}$ code data are recognized, and thus, the state of the $(m+1)^{th}$ code data is recognized. Then, if the state of the $(m+1)^{th}$ code data is the "state 2", the selection switch SW is switched such that the ROM 41A and the extracting circuit 41C are connected to each other, and the record data corresponding to the $m^{th}$ code data is fed into the extracting circuit 41C from the ROM 41A. On the other hand, if the state of the $(m+1)^{th}$ code data is the "state 3", the selection switch SW is switched such that the ROM 41B and the extracting circuit 41C are connected to each other, and the record data corresponding to the $m^{th}$ code data is fed into the extracting circuit 41C from the ROM 41B. Therefore, if the $m^{th}$ code data is the double code data such as the code data CD1 or CD2, the $m^{th}$ code data can be correctly demodulated by using the 8/16 demodulation on the basis of the $(m+1)^{th}$ code data. In addition, if the state of the $(m+1)^{th}$ code data is the "state 1" or the "state 4", the recognition of the state of the $(m+1)^{th}$ code data is not done because there is not the double code data in the "state 1" or the "state 4". Therefore, if the state of the $(m+1)^{th}$ code data is the "state 1" or the "state 4", the same record data are respectively outputted from the ROM 41A and the ROM 41B, so that the selection switch 41C keeps the present state, and the record data corresponding to the $m^{th}$ code data is fed into the extracting circuit 41C from the ROM 41A or the ROM 41B.

Actually, the data outputted from the ROM 41A or the ROM 41B includes the data with respect to the sync part 23 and the PA part 25 other than the record data. The extracting circuit 41C removes the data with respect to the sync part and the PA part, and extracts only the record data.

Here, in case that the last code data placed at the end-part of the data-sector 22 (immediately before the PA part 25) is demodulated, the demodulation section 40 detects the 1st bit and the 13th bit at the MSB side of the PA part 25, and recognizes whether the PA part 25 is, for example, "0001000100000000b" or "1001000100000000b", i.e., the demodulation section 40 recognizes whether the PA part 25 belongs to the "state 2" or the "state 3". Then, if the PA part 25 belongs to the "state 2", the selection switch SW is switched such that the ROM 41A and the extracting circuit 41C are connected to each other, and the record data corresponding to the last code data is fed into the extracting circuit 41C from the ROM 41A. On the other hand, if the PA part 25 belongs to the "state 3", the selection switch SW is switched such that the ROM 41B and the extracting circuit 41C are connected to each other, and the record data corresponding to the last code data is fed into the extracting circuit 41C from the ROM 41B.

Further, the extracting circuit 41C outputs the record data by the unit of one data-sector as a decode signal $S_{DCD}$', and the decode signal $S_{DCD}$' is inputted into the mixing circuit 42, and in the mixing circuit 42, a decode signal $S_{DCD}$ is generated by grouping the 16 data-sectors included in the decode signal $S_{DCD}$' Then, the decode signal $S_{DCD}$ is inputted into the error correcting circuit 43, and in the error correcting circuit 43, a reproduction signal SOUT, whose form is the same as that of the record information before the 8/16 modulation is done, is generated and outputted.

As mentioned above, according to the information reproducing apparatus 200, the last code data placed at the end-part of the data-sector can be demodulated by using the PA recorded on the DVD-RAM 1. Therefore, the last code data can be correctly demodulated by using the 8/16 demodulation, and the code data can be correctly reproduced.

In addition, when the $m^{th}$ code data is demodulated to the record data by using the 8/16 demodulation, it is recognized whether the $(m+1)^{th}$ sync-pattern is the "state 2" or the "state 3". Therefore, the $m^{th}$ code data can be correctly demodulated to the record data. Further, when $m^{th}$ code data is demodulated to the record data by using the 8/16 demodulation, it is recognized whether both of the $(m+1)^{th}$ sync-pattern and the $(m+1)^{th}$ code data are the "state 2" or the "state 3". Therefore, the $m^{th}$ code data can be also correctly demodulated to the record data. In these case, the demodulation tables, in which the sync-patterns shown in FIG. 5 are described, are prepared.

(B) The Second Embodiment of Information Reproducing Apparatus

Figure 9:
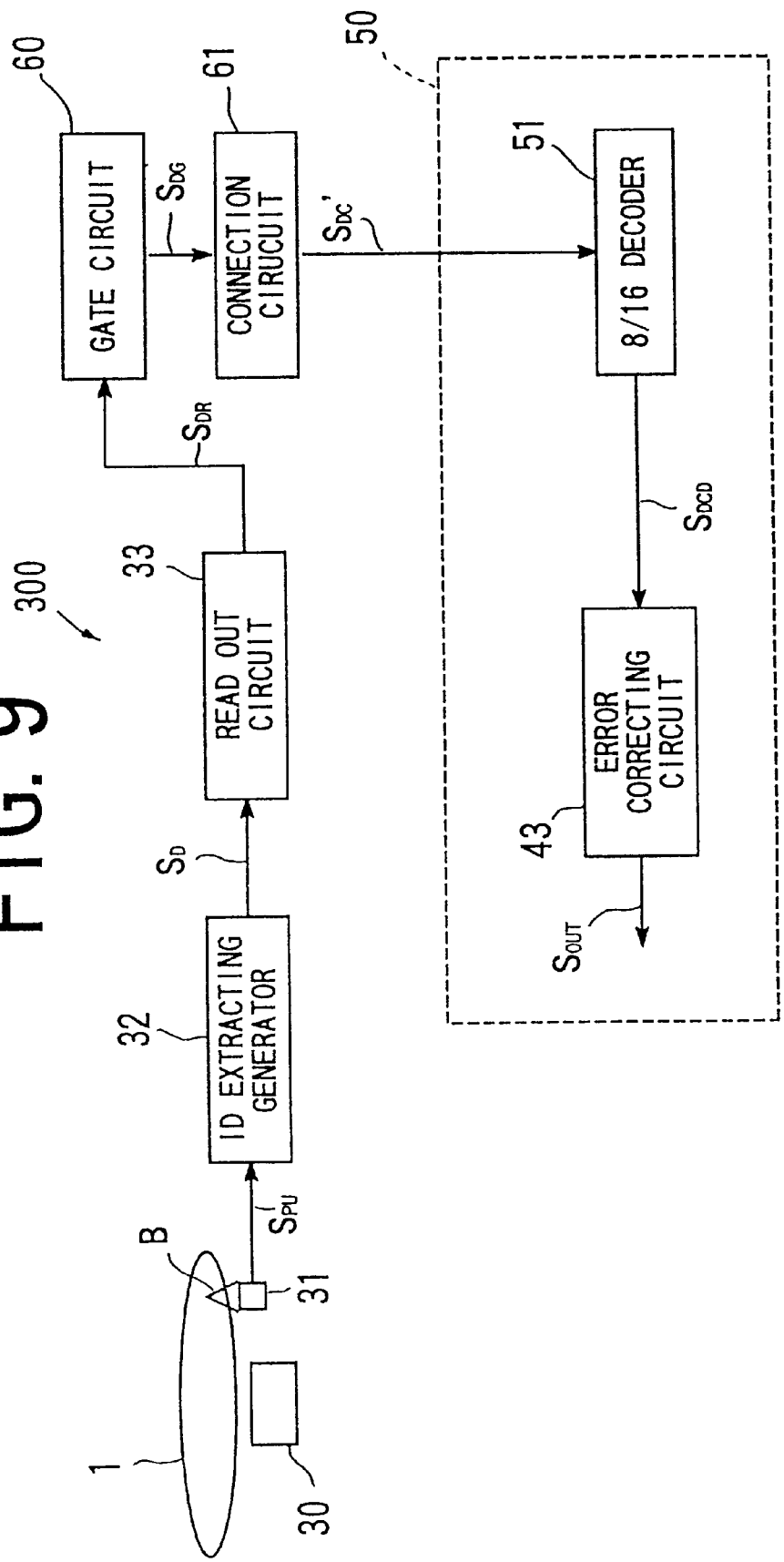
FIG. 9 is a block diagram showing an outline construction of an information reproducing apparatus of the second embodiment.
Figure 10:
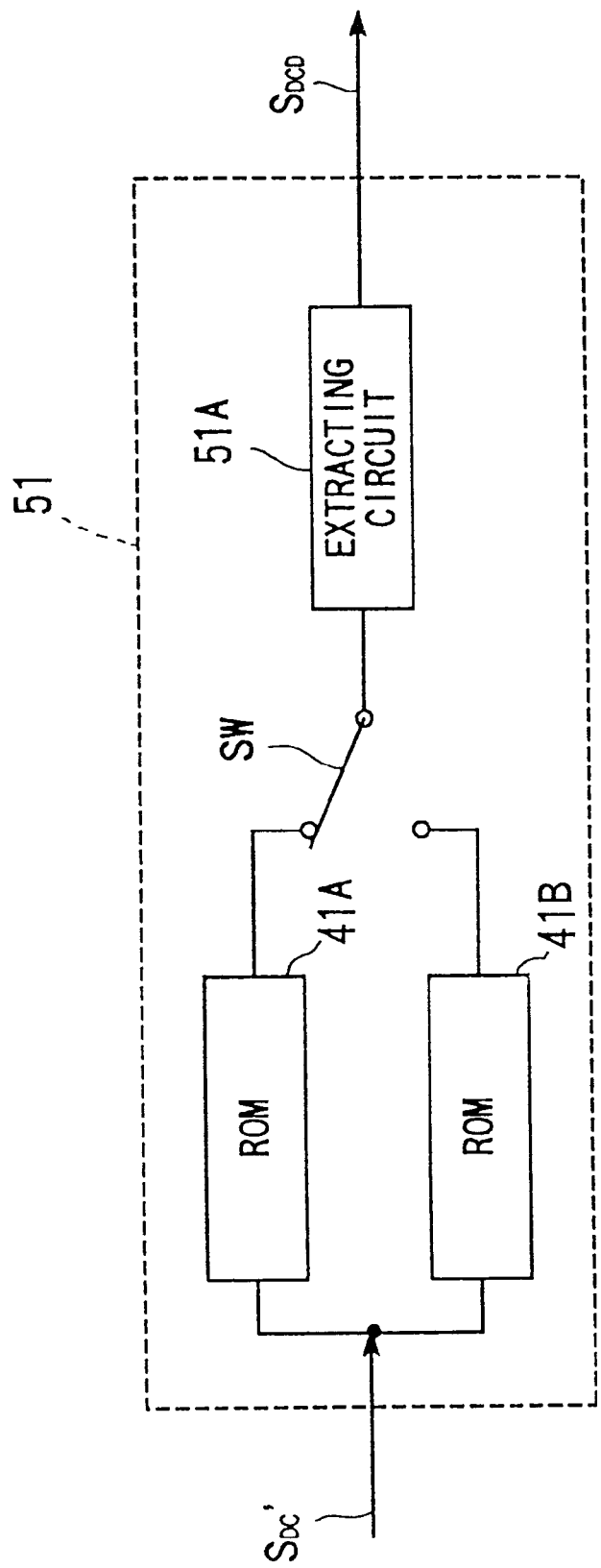
FIG. 10 is a block diagram showing an outline construction of an 8/16 decoder of the second embodiment.

In FIGS. 9 to 12, the construction of an information reproducing apparatus 300 of the second embodiment is shown. The information reproducing apparatus 300 is capable of reproducing not only the DVD-ROM but also the DVD-RAM 1. Namely, the information reproducing apparatus 300 can reproduce the DVD-RAM 1 by using a demodulation section for the DVD-ROM. In FIGS. 9 and 10, same constructional elements as those in FIGS. 7 and 8 carry the same reference numbers and the explanations thereof are omitted.

As shown in the FIG. 9, the information reproducing apparatus 300 is constructed of the spindle motor 30, the optical pickup 31, the ID extracting circuit 32, the read out circuit 33, a gate circuit 60, a connection circuit 61 as one example of a generating device and a demodulation section 50.

Further, the demodulation section 50 is constructed of an 8/16 decoder 51 as one example of a demodulation device and an error correcting circuit 43.

Furthermore, as shown in FIG. 10, the 8/16 decoder 51 is constructed of a ROM 41A, a ROM 41B, a selection switch SW and an extracting circuit 51A.

Next, the operation of the information reproducing apparatus 300 is explained in detail.

Each of the operation of spindle motor 30, the optical pickup 31, the ID extracting circuit 32 and the read out circuit 33 is the same as that of the aforementioned information reproducing apparatus 200, and the detailed explanations with respect to these devices are omitted.

The read out circuit 33 outputs a read out signal $S_{DR}$, and the read out signal $S_{DR}$ is inputted into the gate circuit 60, and then, the gate circuit 60 carries out the separating operation with respect to the last code data placed at the end-part of the data-sector 22 included in the read out signal $S_{DR}$, and the gate circuit 60 generates and outputs a separation signal $S_{DG}$. Further, the connection circuit 61 carries out the connecting operation to carry out the 8/16 demodulation in the same manner as the reproduction for the DVD-ROM.

Figure 11:
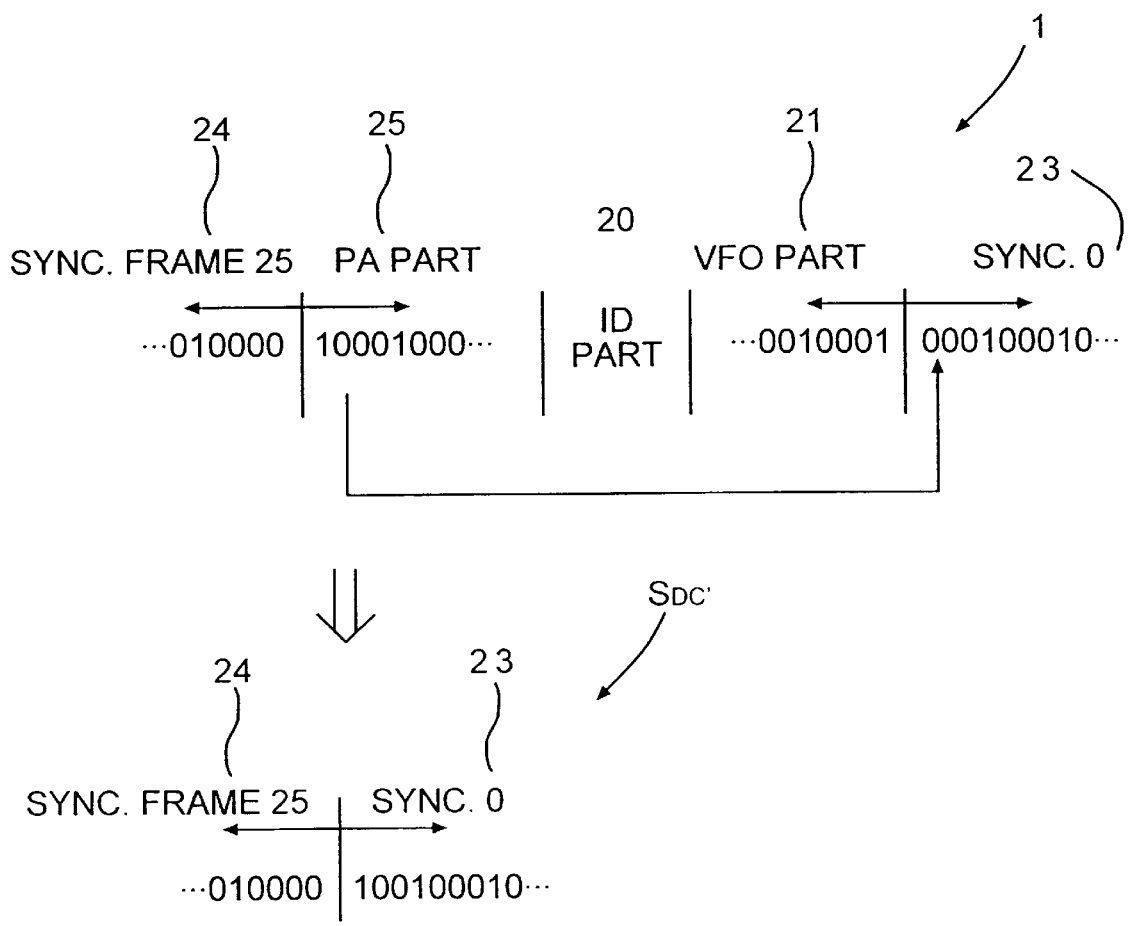
FIG. 11 is a figure for explaining the separating operation and the connecting operation in the information reproducing apparatus of the first embodiment.
Figure 12:
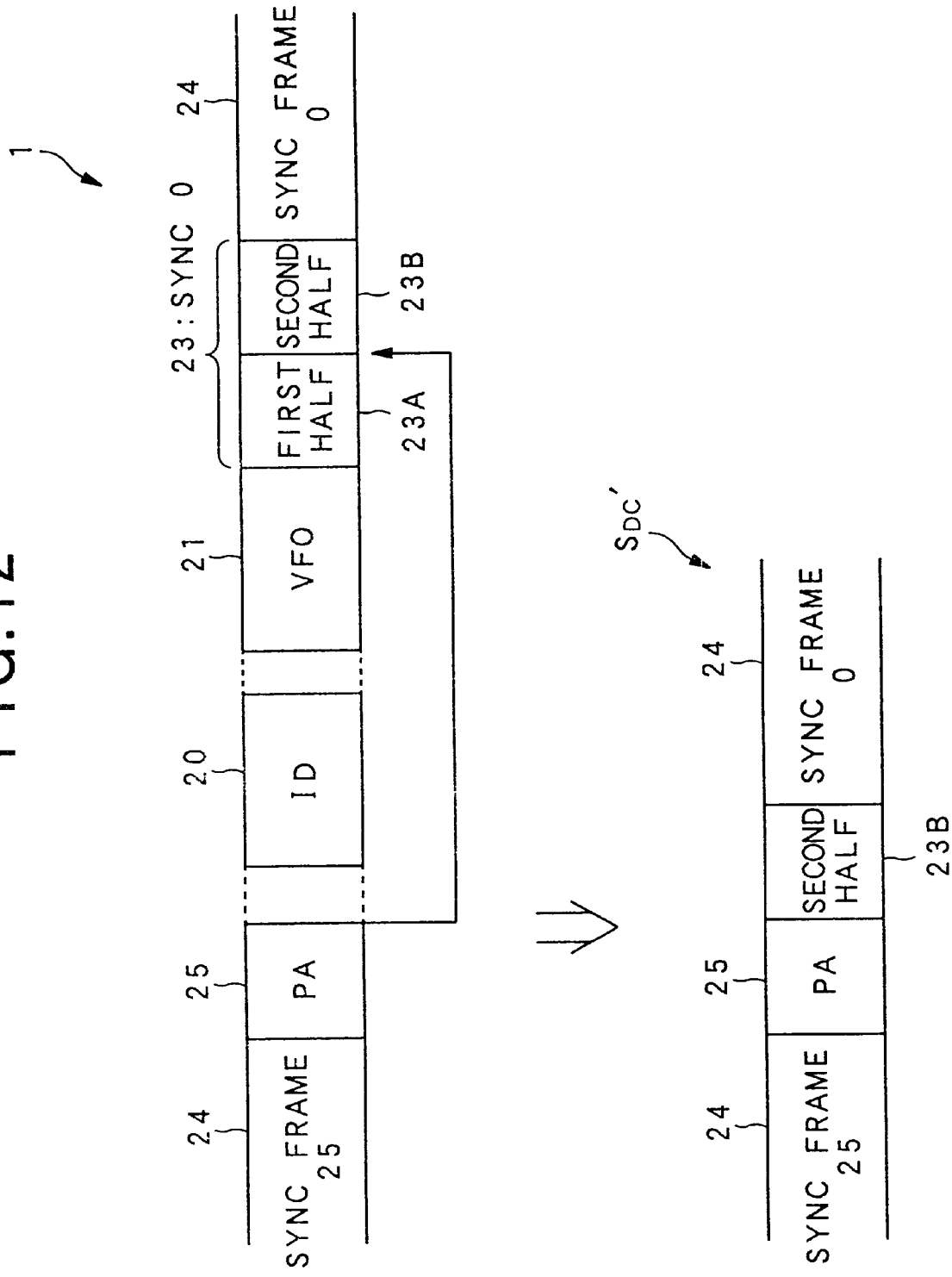
FIG. 12 is a figure for explaining the separating operation and the connecting operation in the information reproducing apparatus of the second embodiment.

Here, referring to FIGS. 11 and 12, two methods of the separating operation in the gate circuit 60 and the connecting operation in the connecting circuit 61 are explained in detail.

At first, one of the methods of the separating operation and the connecting operation is explained.

As shown in FIG. 11, in the gate circuit 60, the read out signal $S_{DR}$ is separated at the place between the top bit (first bit) of the PA part 25 placed at the end-part of the data-sector 22 and the second bit thereof. Further, in the gate circuit 60, the read out signal $S_{DR}$ is also separated at the place between the first bit of the sync 23 placed at the top of the next data-sector and the second bit thereof. Then, the first portion including the top bit of the PA part 25 and the data before this and the second portion including the second bit of the sync 23 of the next data-sector and the following data are respectively outputted from the gate circuit 60 as the separation signal $S_{DG}$.

In the connection circuit 61, the first portion and the second portion are connected to each other such that the top bit of the PA part 25 included in the first portion is adjacent to the second bit of the sync 23 included in the second portion, and connected data (connection data) is outputted from the connection circuit 61 as the connection signal $S_{DC}'$.

In this manner, the top bit of the PA part 25 of the data-sector and the second bit and the following bits of the sync 23 of the next data-sector are connected to each other, and thus, the connected data (connection data) to function as the PA corresponding to the last code data placed at the end-part of the data-sector and as the sync "0" of the next data-sector is generated. In addition, sync "0" included in the data-sector always has the sync-pattern corresponding to the "state 1" or the "state 2", as mentioned above. However, in case that the top bit of the PA part 25 whose bit condition is "1" and sync 23 (sync "0") of the next data-sector are connected to each other as mentioned above, the sync-pattern of the sync "0" is changed from the "state 1" or the "state 2" to the "state 3" or the "state 4". But, if the sync-pattern of the sync "0" is changed like this, the function of the synchronization remains.

Next, the other of the methods of the separating operation and the connecting operation are explained.

As shown in FIG. 12, in the gate circuit 60, the read out signal $S_{DR}$ is separated at the place between the end of the PA part 25 (the end of the data-sector) and the top of the next data-sector. Further, in the gate circuit 60, the read out signal $S_{DR}$ is separated at the place between the first half 23A of the sync 23 place at the top of the next data-sector (the bits of the 1st to 16th of the sync 23) and the second half 23B of the sync 23 of the same (the bits of the 17th to 32nd of the sync 23 included in the next data-sector). Then, the first portion including the PA part 25 and the second portion including the second half 23B of the sync 23 are respectively outputted from the gate circuit 60 as the separation signal $S_{DG}$.

In the connection circuit 61, the first portion and the second portion are connected to each other, and the connected data (connection data) is outputted as the connection signal $S_{DC}'$.

In this manner, the PA part 25 of the data-sector and the second half 23B of the sync 23 of the next data-sector are connected to each other, and thus, the connected data (connection data) to function as the PA corresponding to the last code data placed at the end-part of the data-sector and the sync "0" of the next data-sector is generated.

As mentioned above, in the gate circuit 60 and the connection circuit 61, a couple of the data-sectors adjacent to each other are connected, and the connection signal $S_{DC}'$ is generated, and then, the connection signal $S_{DC}'$ is inputted into the 8/16 decoder 51 included in the demodulation section 50. Here, the connection signal $S_{DC}'$ has the form similar to that of the signal used for the reproduction of the DVD-ROM.

The 8/16 decoder 51 carries out the aforementioned 8/16 demodulation with respect to the code data included in the connection signal $S_{DC}'$, and restores to the record data corresponding to the code data.

Here, the code data which is not the last code data is modulated in the same manner as the aforementioned first embodiment. Namely, in case that $m^{th}$ code data is modulated, one suitable demodulation table is selected on the basis of the state of the $(m+1)^{th}$ code data, and the $m^{th}$ code data is modulated by using the selected demodulation table.

However, in case that the last code data, which is placed at the end-part of the data-sector, is modulated, one suitable demodulation table is selected on the basis of the state of the connection data included in the next data-sector, and the last code data is modulated by using the selected demodulation table.

More specifically, each of the two demodulation table is memorized in each of the ROM 41A and the ROM 41B in the same construction as the aforementioned information reproducing apparatus 200. Then, the connection signal $S_{DC}'$ is respectively inputted into both of the ROM 41A and the ROM 41B, and the last code data of the data-sector included in the connection signal $S_{DC}'$ is independently demodulated in each of the ROM 41A and the ROM 41B. At this time, it is recognized whether the state of the connection data included in the next data-sector (in the connection signal $S_{DC}'$) is the "state 2" or the "state 3. Concretely, the bit condition of the 1st bit and the 13th bit at the MSB side of the 16 bit data place at the beginning-part of the next data-sector are checked. If both of the 1st bit and the 13th bit are "0", the state of the connection data is the "state 2". Therefore, the selection switch SW is switched such that the ROM 41A and the extracting circuit 51A are connected to each other, and the record data corresponding to the $m^{th}$ code data is outputted from ROM 41A to the extracting circuit 51A.

On the other hand, if the 1st bit of the connection data is "1" and the 13th bit of the connection data "0", the state of the connection data is the "state 3". Therefore, the selection switch SW is switched such that the ROM 41B and the extracting circuit 51A are connected to each other, and the record data corresponding to the $m^{th}$ code data is outputted from ROM 41B to the extracting circuit 51A.

Actually, the data outputted from the the ROM 41A or the ROM 41B include the data with respect to the sync-pattern etc other than the record data. Therefore, the extracting circuit 51A removes the data with respect to the sync-pattern, and extracts only the record data, and thus, the decode signal $S_{DCD}$ including the record data constructed 8 bits is obtained.

Then, the decode signal $S_{DCD}$ is inputted into the error correcting circuit 43, and in the error correcting circuit 43, the reproduction signal SOUT, whose form is the same as that of the record information before the 8/16 modulation is done, is generated and outputted.

As mentioned above, according to the information reproducing apparatus 300 of the embodiment, the last code data placed at the end-part of the data-sector can be demodulated and reproduced by using the PA recorded on the DVD-RAM 1. Further, the PA and the sync 23 (sync "0") placed at the top of the data-sector are connected to each other, and thus, the connection signal $S_{DC}'$ having the form similar to that of the signal used for the reproduction of the DVD-ROM is generated. Therefore, the information recorded on the DVD-RAM 1 can be reproduced by a demodulation device used for the reproduction of the DVD-ROM.

Further, in case that the PA part 25 of the data-sector and the second half of the sync 23 of the next data-sector are connected to each other, the 16 bit counter is necessary for separating the second half of the sync 23 from the first half thereof. However, in case that the top bit of the PA part 25 of the data-sector and the second bit of the sync 23 of the next data-sector are connected to each other, the aforementioned 16 bit counter is unnecessary.

On the other hand, in case that the top bit of the PA part 25 of the data-sector and the second bit of the sync 23 of the next data-sector are connected to each other, the divider is necessary for extracting the top bit of the PA part 25 and the second bit of the sync 23. However, in case that the PA part 25 of the data-sector and the second half of the sync 23 of the next data-sector are connected to each other, all data is treated by the unit of the 16 bits, and thus, the aforementioned divider is unnecessary and the construction of the devices and circuits with respect to the gate circuit 61 and the connection circuit 61 etc. can be simplified.

In addition, the methods with respect to the separating operation and the connecting operation are not restricted to the aforementioned cases. In the connecting operation, the $k^{th}$ (K≦16) bit, for example, the 3rd bit of the PA may be connected to the $(k+1)^{th}$ bit, for example, the 4th bit of the first half of the sync 23.

According to the aforementioned embodiments, in case that a plurality of information unrelated to each other are recorded on the DVD-RAM 1, the last code data, which is placed at the end-part of the last data-sector 22 placed at the end-portion included in these information can be demodulated by using the 8/16 demodulation. Therefore, all code data recorded on the DVD-RAN 1 can be correctly demodulated by using the 8/16 demodulation, and all information recorded on the DVD-RAM 1 can be correctly reproduced.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. An information recording apparatus for recording information onto an information recording medium, said apparatus comprising:

an inputting device for inputting record data, whose length is N bits;

a modulation means for modulating the inputted record data to code data, whose length is M (M≧N) bits, by using a predetermined modulation-demodulation method, the predetermined modulation-demodulation method comprising a modulation method, wherein the $(n+1)^{th}$ record data (n: natural number) is modulated to the $(m+1)^{th}$ code data (m: natural number) including demodulating information for selecting a demodulation table to be used for demodulating the $m^{th}$ code data to the $n^{th}$ record data corresponding to the $m^{th}$ code data, and a demodulation method, wherein the demodulation table is selected from a plurality of demodulation tables on the basis of the demodulating information included in the $(m+1)^{th}$ code data, and the $m^{th}$ code data is demodulated to the n th record data corresponding to the $m^{th}$ code data on the basis of the selected demodulation table;

a first recording means for recording a data-sector including a plurality of the modulated code data onto the information recording medium;

a generating means for generating discriminating data including the demodulating information for selecting the demodulation table to be used for demodulating a last code data, which is placed at an end-part of the data-sector, to the record data corresponding to the last code data by using the predetermined modulation-demodulation method on the basis of the inputted record data; and a second recording means for recording the generated discriminating data onto the information recording medium at the place after the last code data.

2. The information recording apparatus according to claim 1, wherein the inputting device inputs the record data whose length is 8 bits, and the modulation means modulates the inputted record data to the code data whose length is 16 bits by using an 8/16 modulation-demodulation method.

3. The information recording apparatus according to claim 1, wherein the generating means generates the discriminating data whose length is the same as the length of the code data.

4. An information recording medium for storing data to be reproduced by an information reproducing apparatus, comprising a data structure stored in the information recording medium, said data structure comprising a plurality of data-sectors, each of the data-sectors including:

a plurality of code data, a length of each of the code data being M bits, each of the code data being obtained to modulate each record data whose length is N (N≦M) bits by using a predetermined modulation-demodulation method, the predetermined modulation-demodulation method comprising a modulation method, wherein the $(n+1)^{th}$ record data (n: natural number) is modulated to the $(m+1)^{th}$ code data (m: natural number) including demodulating information for selecting a demodulation table to be used for demodulating the $m^{th}$ code data to the $n^{th}$ record data corresponding to the $m^{th}$ code data, and a demodulation method, wherein the demodulation table is selected from a plurality of demodulation tables on the basis of the demodulating information included in the $(m+1)^{th}$ code data, and the $m^{th}$ code data is demodulated to the $n^{th}$ record data corresponding to the $m^{th}$ code data on the basis of the selected demodulation table; and a discriminating data placed after a last code data, which is placed at the end-part of the data-sector stored in the information recording medium, the discriminating data including the demodulating information for selecting the demodulation table to be used for demodulating the last code data to the record data corresponding to the last code data by using the predetermined modulation-demodulation method.

5. The information recording medium according to claim 4, wherein a length of the record data is 8 bits and a length of the code data is 16 bits.

6. An information reproducing apparatus for reproducing information included in a data-sector recorded on an information recording medium, the data-sector including a plurality of code data and a discriminating data, a length of each of the code data being M bits, each of the code data being obtained to modulate each record data whose length is N (N≦M) bits by using a predetermined modulation-demodulation method, the predetermined modulation-demodulation method comprising a modulation method wherein the $(n+1)^{th}$ record data (n: natural number) is modulated to the $(m+1)^{th}$ code data (m: natural number) including demodulating information for selecting a demodulation table to be used for demodulating the $m^{th}$ code data to the $n^{th}$ record data corresponding to the $m^{th}$ code data, and a demodulation method wherein the demodulation table is selected from a plurality of demodulation tables on the basis of the demodulating information included in the $(m+1)^{th}$ code data, and the $m^{th}$ code data is demodulated to the $n^{th}$ record data corresponding to the $m^{th}$ code data on the basis of the selected demodulation table, the discriminating data placed after a last code data, which is placed at an end-part in the data-sector stored in the information recording medium, the discriminating data including the demodulating information for selecting the demodulation table to be used for demodulating the last code data to the record data corresponding to the last code data by using the predetermined modulation-demodulation method, said apparatus comprising:

a detecting device for detecting the data-sector recorded on the information recording medium;

an extracting means for extracting each of the code data and the discriminating data from the detected data-sector;

a first demodulation means for demodulating each of the extracted code data to the record data corresponding to each of the extracted code data by using the predetermined modulation-demodulation method when the extracted code data is not a last code data; and a second demodulation means for demodulating the last code data to the record data corresponding to the last code data by a method, wherein the demodulation table is selected from the demodulation tables on the basis of the demodulating information included the extracted discriminating data, and the last code data is demodulated to the record data corresponding to the last code data on the basis of the selected demodulation table, when the extracted code data is the last code data.

7. The information recording apparatus according to claim 6, wherein a length of the record data is 8 bits, a length of the code data is 16 bits, and the first demodulation means demodulates the extracted code data to record data by using an 8/16 modulation-demodulation method.

8. An information reproducing apparatus for reproducing information included in a first data-sector and a second data-sector respectively recorded on an information recording medium, each of the first data-sector and the second data-sector including a synchronous data, plurality of code data and a discriminating data, the synchronous data placed at a top-part of each of the first data-sector and the second data-sector, a length of each of the code data being M bits, a length of the synchronous data being L bits (L>M), each of the code data arrayed immediately after the synchronous data in each of the first data-sector and the second data-sector, each of the code data being obtained to modulate each record data whose length is N (N≦M) bits by using a predetermined modulation-demodulation method, the predetermined modulation-demodulation method comprising a modulation method, wherein the $(n+1)^{th}$ record data (n: natural number) is modulated to the $(m+1)^{th}$ code data (m: natural number) including demodulating information for selecting a demodulation table to be used for demodulating the $m^{th}$ code data to the $n^{th}$ record data corresponding to the $m^{th}$ code data, and a demodulation method, wherein the demodulation table is selected from a plurality of demodulation tables on the basis of the demodulating information included in the $(m+1)^{th}$ code data, and the $m^{th}$ code data is demodulated to the $n^{th}$ record data corresponding to the $m^{th}$ code data on the basis of the selected demodulation table, the discriminating data placed after a last code data, which is placed at an end-part of each of the first data-sector and the second data-sector respectively stored in the information recording medium, the discriminating data including the demodulating information for selecting the demodulation table to be used for demodulating the last code data to the record data corresponding to the last code data by using the predetermined modulation-demodulation method, a length of the discriminating data being the same as the length of the code data, said apparatus comprising:

a detecting device for detecting the first data-sector and the second data-sector respectively recorded on the information recording medium;

extracting means for extracting the synchronous data, each of the code data and the discriminating data from each of the detected first data-sector and detected second data-sector;

generating means for generating a connection data by connecting K (1≦K≦M) bits at the beginning part MSB side of the discriminating data included in the first data-sector and a $(L-K)^{th}$ bit at the beginning part MSB side and the following bits of the synchronous data included in the second data-sector;

first demodulation means for demodulating each of the extracted code data to the record data corresponding to each of the extracted code data by using the predetermined modulation-demodulation method, when the extracted code data is not a last code data; and second demodulation means for demodulating the last code data to the record data corresponding to the last code data by a method, wherein the demodulation table is selected from a plurality of demodulation tables on the basis of the generated connecting data, and the last code data is demodulated to the record data corresponding to the last code data on the basis of the selected demodulation table, when the extracted code data is the last code data.

9. The information recording apparatus according to claim 8, wherein a length of the record data is 8 bits, a length of the code data is 16 bits, and the first demodulation means demodulates the extracted code data to record data by using an 8/16 modulation-demodulation method.

10. The information reproducing apparatus according to claim 9, wherein, the generating means generates the connection data by connecting a first bit at the beginning part MSB side of the discriminating data including in the first data-sector and a second bit at the beginning part MSB side and the following bits of the synchronous data included in the second data-sector.

11. An information recording apparatus for recording information onto an information recording medium comprising:

an inputting terminal from which record data, whose length is N bits, is inputted;

modulating means for modulating the inputted record data into code data, whose length is M bits, where M is greater than N, by using one of a plurality of modulation tables on the basis of preceding code data;

generating means for generating discriminating data indicating a demodulation table to be used for demodulating a last code data within a predetermined data unit, the data unit including a plurality of the code data; and recording means for recording the data unit and the discriminating data, the discriminating data being recorded at a place after the last code data, onto the information recording medium.

12. The information recording apparatus according to claim 11, wherein the inputting terminal inputs the record data, whose length is 8 bits, and the modulating means modulates the inputted record data to the code data, whose length is 16 bits, by using an 8/16 modulation-demodulation method.

13. The information recording apparatus according to claim 11, wherein the generating means generates the discriminating data whose length is the same as the length of the code data.

14. An information recording medium for storing data to be reproduced by an information reproducing apparatus, comprising a data structure comprising a plurality of data units, each of the data units including:

a plurality of code data, whose length is M bits, each of the plurality of code data being obtained by modulating record data, whose length is N bits, where M is greater than N, by using one of a plurality of modulation tables selected on the basis of preceding code data; and discriminating data placed after a last code data within the data unit, the discriminating data indicating a demodulation table to be used for demodulating the last code data.

15. The information recording medium according to claim 14, wherein each of the data units includes the plurality of code data, whose length is 16 bits, and each of which is obtained by modulating the record data, whose length is 8 bits, by using an 8/16 modulation-demodulation method.

16. The information recording medium according to claim 14, wherein a length of the discriminating data is the same as the length of the code data.

17. An information reproducing apparatus for reproducing information recorded on an information recording medium comprising a data structure comprising a plurality of data units, each of the data units including:

a plurality of code data, whose length is M bits, each of the plurality of code data being obtained by modulating record data, whose length is N bits, where M is greater than N, by using one of a plurality of modulation tables selected on the basis of preceding code data; and discriminating data placed after a last code data within the data unit, the discriminating data indicating a demodulation table to be used for demodulating the last code data, the apparatus comprising:

detecting means for detecting the data unit recorded on the information recording medium;

extracting means for extracting the code data and the discriminating data from the detected data unit; and demodulating means for demodulating each of the extracted code data by using one of a plurality of demodulation tables on the basis of succeeding code data, and for demodulating the last code data by using of the plurality of demodulation tables on the basis of the discriminating data.

18. The information reproducing apparatus according to claim 17, wherein each of the data units of the information recording medium includes the plurality of code data, whose length is 16 bits; each of the plurality of code data is obtained by modulating the record data, whose length is 8 bits, by using an 8/16 modulation-demodulation method; and the demodulating means of the apparatus demodulates each of the extracted code data and the last code data by using the 8/16 modulation-demodulation method.

19. The information reproducing apparatus according to claim 17, wherein a length of the discriminating data is the same as the length of the code data.

20. An information reproducing apparatus for reproducing information recorded on an information recording medium comprising a data structure comprising a plurality of data units, each of the data units including:

a plurality of code data, whose length is M bits, each of the plurality of code data being obtained by modulating record data, whose length is N bits, where M is greater than N, by using one of a plurality of modulation tables selected on the basis of preceding M-bit code data; and discriminating data placed after a last code data within the data unit, the discriminating data indicating a demodulation table to be used for demodulating the last code data; and synchronous data which is placed before the plurality of code data, a length of the synchronous data being L bits, where L is greater than M, the apparatus comprising:

detecting means for detecting the data unit recorded on the information recording medium;

extracting means for extracting the synchronous data, the code data and the discriminating data from the detected data unit;

demodulating means for demodulating each of the extracted code data by using one of a plurality of demodulation tables on the basis of succeeding code data, and for demodulating the last code data by using one of the plurality of demodulation tables on the basis of the discriminating data;

separating means for separating the synchronous data into a first portion and a second portion; and connecting means for connecting the discriminating data and the second portion of synchronous data included in succeeding data unit and for producing new synchronous data.

21. The information reproducing apparatus according to claim 20, wherein each of the data units of the information recording medium includes the plurality of code data, whose length is 16 bits; each of the plurality of code data is obtained by modulating record data, whose length is 8 bits, by using an 8/16 modulation-demodulation method; and the demodulating means of the apparatus demodulates each of the extracted code data and the last code data by using the 8/16 modulation-demodulation method.

22. The information reproducing apparatus according to claim 20, wherein a length of the discriminating data is the same as the length of the code data.

23. The information reproducing apparatus according to claim 20, wherein the length of the synchronous data is twice as long as the length of the code data.

24. A data modulation method for modulating N-bits data, whose length is N bits, into M-bits code data, whose length is M bits, where M is greater than N, comprising the steps of:

providing N-bits data;

modulating the provided N-bits data into M-bits code data by using one of a plurality of modulation tables on the basis of preceding M-bits code data;

forming a predetermined data unit including a plurality of the M-bits code data;

generating discriminating data indicating a demodulation table to be used for demodulating a last M-bits code data, which is placed at an end part of the data unit; and adding the discriminating data at a place after the last M-bits code data.

25. The data modulation method according to claim 24, wherein the length of the N-bits data is 8 bits, and the length of the M-bits code data is 16 bits.

26. The data modulation method according to claim 24, wherein a length of the discriminating data is the same as the length of the code data.

27. A data demodulation method for demodulating M-bits code data, whose length is M bits, into N-bits data, whose length is N bits, where M is greater than N, comprising the steps of:

obtaining a data unit including a plurality of M-bits code data and discriminating data;

extracting the M-bits code data and the discriminating data from the data unit; and demodulating each of the extracted M-bits code data by using one of a plurality of demodulation tables on the basis of succeeding M-bits code data, and for demodulating a last M-bits code data within the data unit by using one of the plurality of demodulation tables on the basis of the discriminating data.

28. The data modulation method according to claim 27, wherein the length of the N-bits data is 8 bits, and the length of the M-bits code data is 16-bits.

29. The data modulation method according to claim 27, wherein a length of the discriminating data is the same as the length of the code data.

* * * * *

UNITED STATES PATENT AND TRADEMARK OFFICE
CERTIFICATE OF CORRECTION

PATENT NO. : 6,058,087
DATED : May 2, 2000
INVENTOR(S) : Tomita

It is certified that error appears in the above-identified patent and that said Letters Patent is hereby corrected as shown below:

Column 18, line 39, change "n th" to --$n^{th}$--.

Column 22, line 28, after "using" insert --one--.

Signed and Sealed this

Twenty-second Day of May, 2001

*Attest:*

NICHOLAS P. GODICI

*Attesting Officer*　　　　*Acting Director of the United States Patent and Trademark Office*